United States Patent [19]

Wagner et al.

[11] Patent Number: 5,659,172
[45] Date of Patent: Aug. 19, 1997

[54] RELIABLE DEFECT DETECTION USING MULTIPLE PERSPECTIVE SCANNING ELECTRON MICROSCOPE IMAGES

[75] Inventors: Mark Wagner, Rehovot; Noam Dotan, Givatayim, both of Israel

[73] Assignee: Opal Technologies Ltd., Nes Ziona, Israel

[21] Appl. No.: 606,363

[22] Filed: Feb. 23, 1996

Related U.S. Application Data

[63] Continuation of Ser. No. 493,038, Jun. 21, 1995, abandoned.
[51] Int. Cl.$^6$ .................................................. H01J 37/00
[52] U.S. Cl. ........................ 250/307; 250/310; 382/145
[58] Field of Search ................................. 250/307, 306, 250/310, 397; 382/144, 145, 147

[56] References Cited

U.S. PATENT DOCUMENTS

| | | | |
|---|---|---|---|
| 4,460,827 | 7/1984 | Onoguchi et al. | 250/306 |
| 4,794,646 | 12/1988 | Takeuchi et al. | 250/306 |
| 4,805,123 | 2/1989 | Specht et al. | 364/559 |

*Primary Examiner*—Kiet T. Nguyen
*Attorney, Agent, or Firm*—Mark M. Friedman

[57] ABSTRACT

A method for fast and reliable defect detection on semiconductor devices by comparing SEM images from a single perspective followed by a cross-check between at least two perspectives. An SEM equipped with at least two electron detectors each of which is capable of collecting electrons from different angular sectors. 'Base' images of an area of the semiconductor wafer which is to be inspected are generated from both perspectives. For each perspective base image, a perspective 'reference' image is generated, which is suitable for comparison with the base image. The reference image is registered with respect to the base image, for each perspective, the reference image is compared with the base image, and a comparison map of possible defect locations is produced, and, finally, a cross-check is carried out between the perspective comparison maps. The cross-check filters out events in the perspective comparison maps relating to variations other than defects such as pattern variations and noise.

17 Claims, 8 Drawing Sheets

Completed comparison map before dilation

Completed comparison map after dilation

FIG. 10

▨ New pixel

Case 1:

New candidate defect

New pixel added to a single existing candidate defect

Case 2:

New candidate defect

New pixel combines two existing candidate defects to a single new candidate defect

Case 3:

New candidate defect

Create a new candidate

RELIABLE DEFECT DETECTION USING MULTIPLE PERSPECTIVE SCANNING ELECTRON MICROSCOPE IMAGES

This is a continuation of U.S. patent application Ser. No. 08/493,038, filed Jun. 21, 1995 now abandoned.

FIELD AND BACKGROUND OF THE INVENTION

The present invention relates to a method for detection of defects on semiconductor wafers using a scanning electron microscope (SEM) and, more particularly, to a method for fast and reliable detection of defects by comparing a number of SEM images, each of which contains different information about the semiconductor device.

Defects on semiconductor wafers, such as particulate contamination, may render the wafers inoperative. Therefore, when manufacturing semiconductors, a quality inspection is usually performed to detect defects on the semiconductor wafers. Over the years, two main approaches—optical inspection and SEM inspection—have been developed and used to detect defects on semiconductor wafers.

Optical inspection of semiconductor wafers for defects detection is considered an effective and low cost method and is, therefore, the most widely used approach.

Various methods for detecting defects on semiconductor wafers using optical inspection equipment have been developed. For example, U.S. Pat. No. 4,805,123 to Specht et al., discloses a photomask and reticle inspection method and apparatus, wherein an examined surface area of a given image is compared with a corresponding reference area.

Also known are various methods for defect detection using SEM based equipment. For example, U.S. Pat. No. 4,794,646 to Jakeuchi et al. discloses an apparatus for detecting semiconductor wafer pattern defects wherein an inspected wafer area is compared to an image constructed from information, such as design rules, in a database.

As features on semiconductors become smaller than the wavelength of visible light, the size of defects which have to be detected falls below the resolution of conventional light optics. As a result, optical inspection systems become increasingly unreliable. Furthermore, even if the defect can be detected with optical systems, the resolution is such that it is impossible to extract accurate additional information, such as defect size and defect boundary. So the ability of optical systems to classify defects is highly limited.

Scanning electron microscopes (SEM) are capable of resolving features more than an order of magnitude smaller than the wavelength of visible light, and are, therefore, natural candidates for carrying out defect detection and classification on these scales. In order for an SEM-based semiconductor wafer defect detection method to be feasible for industrial purposes, the inspection must be fast and reliable and must generate as few false alarms as possible.

However, since speed requires images to be generated employing a large field of view, and since the faster electron microscope scanning is carried out, the poorer is the image contrast-to-noise ratio, defects covering small areas of the image are difficult to distinguish from pattern variations and noise, rendering fast scanning by existing SEM equipment, impractical due to the serious constraints on the image quality produced.

As mentioned, for speed purposes, it is required to generate images in a large field of view. This, in turn, means that defects covering only a small fraction of the semiconductor wafer image are obtained. Therefore, the image of any given defect carries relatively little information, typically insufficient for purposes of identifying and characterizing it with respect to the wafer pattern.

Rapidly acquired, large field of view, SEM image variations which are not associated with semiconductor wafer defects are well known. There is a legitimate pattern variation between two ideally identical semiconductor wafer areas, which, at SEM resolution, using the comparative approach described, may easily be interpreted as a defect. A second source of variations, not associated with semiconductor wafer defects, is variations characterizing the image formation process itself, such as noise or difference in focus. In both cases, the larger the variation, the higher the potential for false alarm.

The source of contrast in SEM images depends, to a large extent, on the energy range of the emitted electrons. For example, for backscattered electrons, contrast mostly reflects differences of material types. Although semiconductor wafers are made of a combination of materials, there is no guarantee that defects and wafer patterns are made of different materials. On the other hand, contrast produced by secondary electrons, emitted from the scanned object and having energy less than 50 eV, depends almost entirely on surface topography. This contrast is more suitable for semiconductor wafer defect detection.

The contrast-to-noise ratio for secondary electrons is inherently rather low but there are standard ways in which this ratio can be improved (see, for example, the book of L. Reimer, Image Formation in Low-Voltage Scanning Electron Microscopy, SPIE Optical Engineering Press, 1993).

One way to improve the contrast-to-noise ratio associated with secondary electrons is to use detectors devised to collect secondary electrons emitted from the wafer which are scattered in a limited angular sector, rather than collecting them all. Explicitly, edges scattering electrons in the direction of the detector will be brightened while edges facing away from the detector will be darkened. The effect of this shading is to greatly enhance image contrast. Secondary electron images formed from collecting secondary electrons in some limited angular sectors are referred to herein as 'perspective images'. Detectors collecting secondary electrons of different angular sectors produce perspective images carrying different information about the wafer pattern.

Perspective imaging improves topographic contrast, but it does nothing to overcome the problems of the prior art described above of SEM scanning in a large field of view and comparing variation between images.

There is thus a widely recognized need for, and it would be highly advantageous to have, a fast and reliable method aimed at detecting defects in semiconductor wafers based on a comparison of perspective images and capable of filtering out large variations between compared images.

SUMMARY OF THE INVENTION

According to the present invention there is provided a method for fast, reliable defect detection on semiconductor devices by comparing SEM images from a single perspective followed by a cross-check between at least two perspectives.

According to further features in preferred embodiments of the invention described below, the invention requires an SEM equipped with at least two secondary electron detectors each of which is capable of collecting electrons from different angular sectors.

According to still further features in the described preferred embodiments, 'base' images of an area of the semiconductor wafer which is to be inspected are generated simultaneously from both perspectives. For each perspective base image, a perspective 'reference' image is generated, which is suitable for comparison with the base image.

According to yet further features in the described preferred embodiments, for each perspective, the reference image is registered with respect to the base image, for each perspective, the reference image is compared with the base image, and a comparison map of possible defect locations is produced, and, finally, a cross-check is carried out between the perspective comparison maps. The cross-check filters out events in the perspective comparison maps relating to variations other than defects such as pattern variations and noise. As a result, a completed comparison map is produced with significantly fewer false alarms than the perspective comparison maps themselves.

The present invention successfully addresses the shortcomings of the presently known configurations by providing a method for fast and reliable defect detection on semiconductor devices by comparing SEM images from a single perspective followed by a cross-check between at least two perspectives resulting in significantly fewer false alarms.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a method for fast and reliable defect detection on semiconductor devices by comparing SEM images from a single perspective, followed by a cross-check with one or more other perspectives.

For ease of presentation, all further descriptions refer to semiconductor wafers, it being understood that the methods of the present invention are suitable for other applications, including, but not limited, to those mentioned above, all of which are intended to fall within the scope of the present invention.

The principles and operation of a method for fast and reliable defect detection on semiconductor devices according to the present invention may be better understood with reference to the drawings and the accompanying description.

Figure 1:
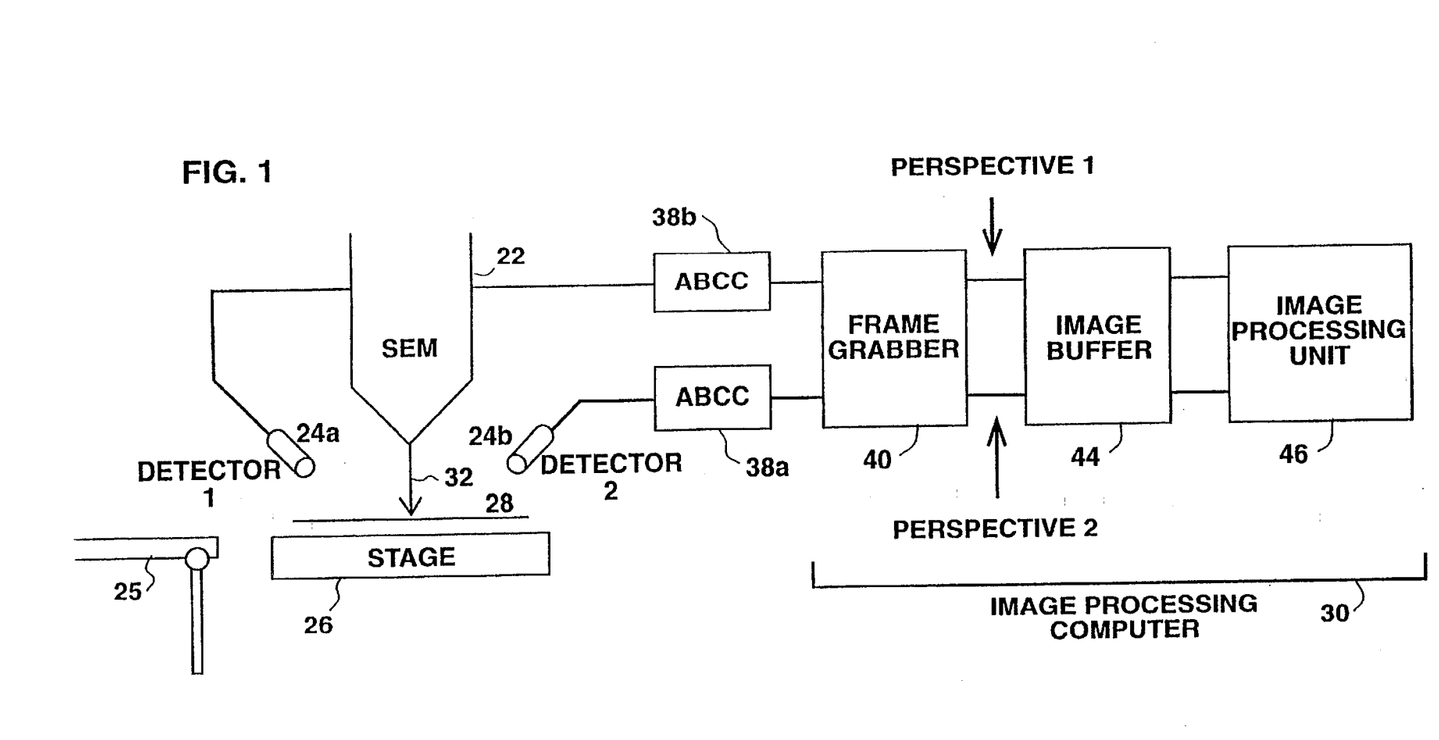
FIG. 1 is a schematic depiction of a semiconductor wafer defect detection apparatus according to the present invention.

Referring now to the drawings, FIG. 1 schematically illustrates an apparatus 20, for carrying out a semiconductor wafer defect detection according to the present invention. The principal components of apparatus 20 are a SEM 22, two secondary electron detectors, 24a and 24b, each of secondary electron detectors, 24a and 24b, being oriented towards a stage 26 on which an inspected semiconductor wafer 28 is placed, and an image processing computer 30. Each of secondary electron detectors, 24a and 24b, collects electrons from a different angular sector which is smaller than 180°.

Several different detector configurations are possible for generating perspective images. One possibility is that the two detectors are both 'external' to the SEM column and are placed so as to collect electrons from some limited angular sector. Another possibility is that the SEM itself is designed so that detectors can be placed in the SEM column, so called 'in lens' detectors. In this case two perspectives can be generated by tilting the sample, having one 'in lens' detector and one 'external' detector. Yet another possibility is that two perspectives can be generated by two 'in lens' detectors. All the detectors so far mentioned have related to secondary electron emission. However, a two perspective configuration can also be obtained with one detector for secondary electrons and one detector for back scattered electrons.

For ease of presentation, in the method of the invention, as is described herein, two secondary electron detectors are employed. Nevertheless, as will become apparent to those skilled in the art, more than two secondary electron detectors may be used.

A semiconductor wafer includes an array of identical dies. A fraction of a die is referred to herein as a wafer area, whereas a wafer area which is to be inspected is referred to herein as a wafer base area. Since any given wafer area is supposedly identical to corresponding wafer areas of any of the dies in a semiconductor wafer, any of the corresponding wafer areas may serve as an inspected reference area for the inspected base area. In a preferred embodiment, a single inspected reference area is used, which reference area is contained in a first die, which first die is a neighboring die to a second die, which second die contains the inspected base area. Other embodiments of the method of the present invention make use of two or more inspected reference areas for each inspected base area. Using more than one inspected reference area increases the degree of certainty regarding the presence of a defect and its location on the semiconductor wafer.

The semiconductor wafer 28 is placed on the stage 26 by a suitable wafer handling device 25. Stage 26 is then moved to a position which brings the wafer base area to be inspected, under SEM 22 electron beam 32, and two base perspective images of the wafer base area are generated simultaneously by detectors, 24a and 24b. Stage 26 is then moved to a position which brings the wafer reference area to be inspected under SEM 22 electron beam 32, and two perspective SEM images of the wafer reference area are generated simultaneously by detectors, 24a and 24b.

The process of simultaneous image generation of a particular wafer area (either base or reference) by each of detectors, 24a and 24b, is carried out as follows:

A fraction of the area (either base or reference) is scanned, and an analog signal is transmitted from detectors, 24a and 24b to automatic brightness and contrast control (ABCC) units, 38a and 38b, respectively, which then set the detectors gain and offset so that all images have a maximal dynamic range and differences in image intensity are reduced. In a preferred embodiment, ABCC units, 38a and 38b are a standard component, available, for example from Zeiss.

After the gain and offset of each of detectors, 24a and 24b, are set by the corresponding ABCC units, 38a and 38b, the entire area (either base or reference) is scanned, and an analog signal is transmitted from detectors, 24a and 24b, to a frame grabber 40 which is a component of the image processing computer 30. Horizontal and vertical synchronization signals from the scanning unit of SEM 22 are also transmitted to frame grabber 40. The synchronization signals are used to generate the perspective image obtained from each of detectors, 24a and 24b, analog signals. Perspective images thus generated are stored in an image buffer unit 44 and await processing by the image processing unit 46 of the image processing computer 30. Having generated at least one set of base and reference perspective images in image buffer unit 44, processing by image processing unit 46 may begin.

Figure 2:
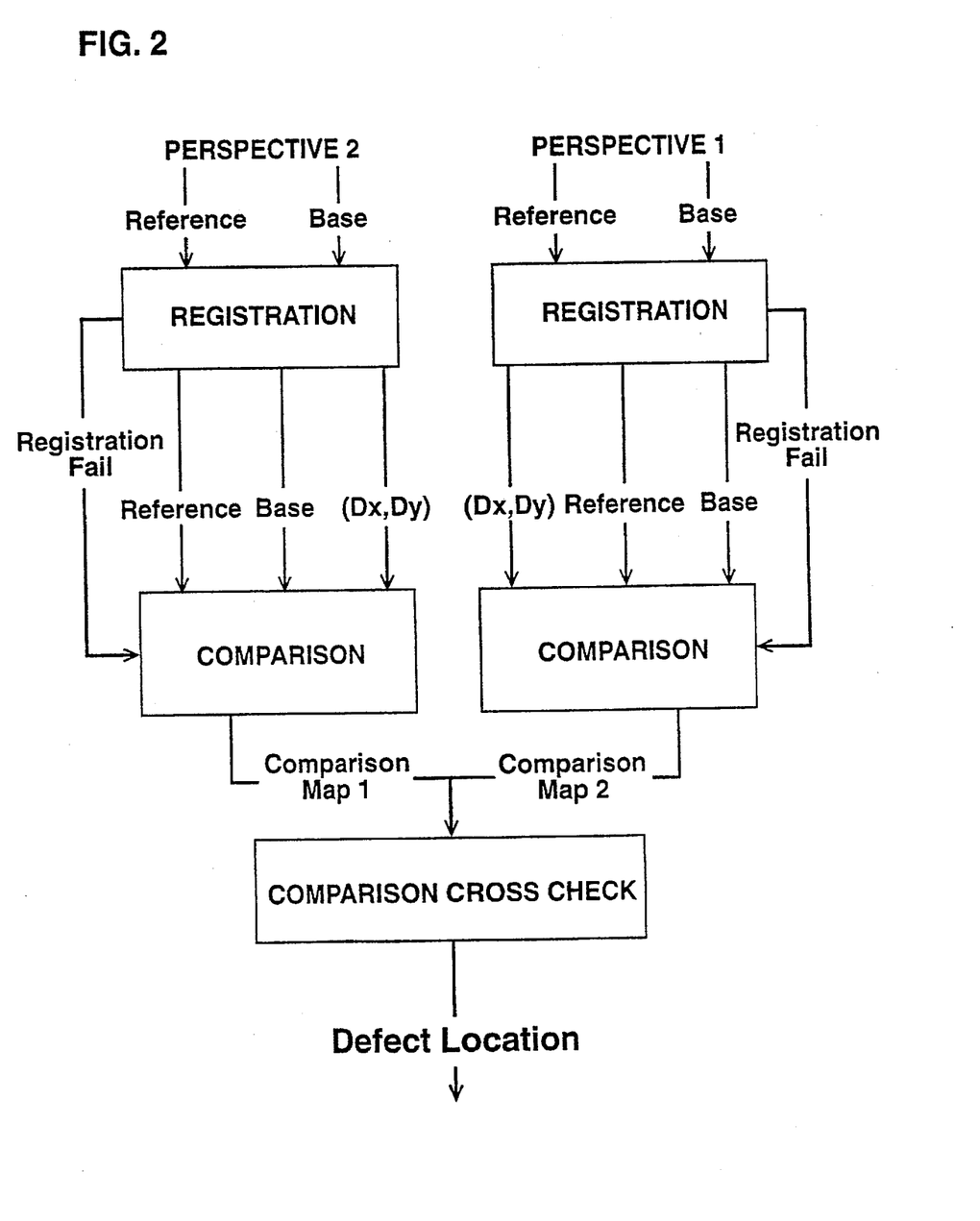
FIG. 2 is a schematic depiction of an image processing flow according to the present invention.

The overall flow of data for image processing according to the present invention is shown in FIG. 2 and, as will be described in detail below, the image processing includes three main successive steps: (i) a registration step; (ii) a comparison step; and (iii) a comparison cross-checking step. As further shown in FIG. 2, the registration and comparison steps are carried out on each perspective image of any given reference and base areas, separately, whereas during the comparison cross-checking step, information from both perspective images is cross checked.

Figure 3:
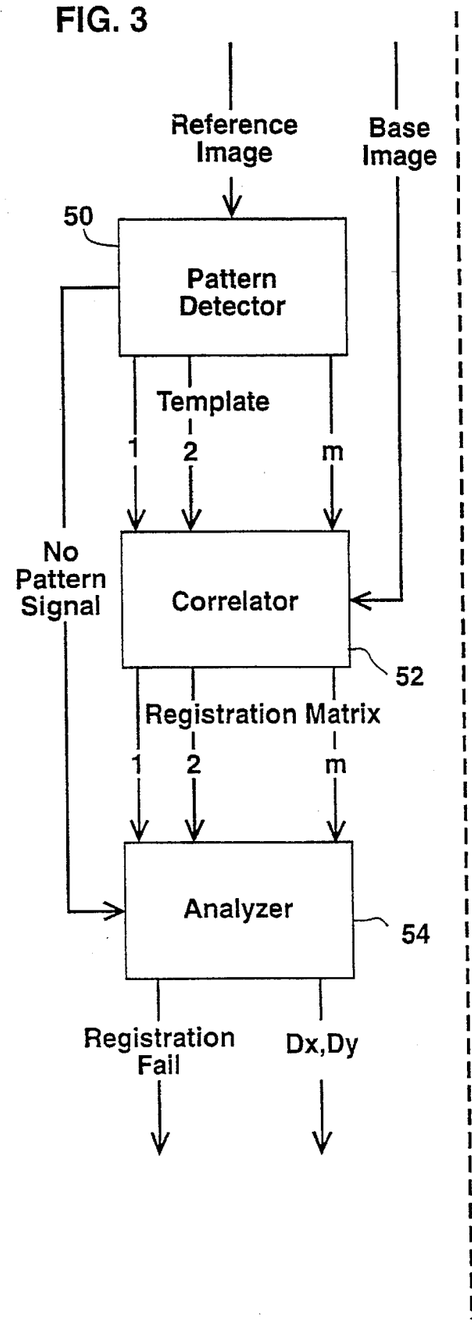
FIG. 3 is a schematic depiction of the registration process which is the first step in an image processing flow according to the present invention.

The flow of data during the registration step, which, as shown in FIG. 2, is the first step of the image processing flow, is shown in FIG. 3. Registration herein refers to a registration correction process in which differences between the base image and the reference image are corrected. These differences are introduced because the images were generated from somewhat different locations on the semiconductor wafer, due to, for example, accuracy limitations of stage 26.

Furthermore, the registration correction process is also required to correct a locational misregistration, which is assumed to be a coordinate translation (Dx,Dy), limited by a search window having dimensions of N×N. The dimensions of the search window, N×N, to a great extent depend on the mechanical accuracy of stage 26 in a particular system being used. Misregistrations requiring a more complex registration correction process, such as, for example, rotations, are assumed to be negligible.

As further shown in FIG. 3, the registration step is divided into three successive stages: (i) a pattern detection stage, carried out by a pattern detector 50; (ii) a correlation stage, carried out by a correlator 52; and (iii) an analyzing stage, carried out by an analyzer 54.

Figure 4:
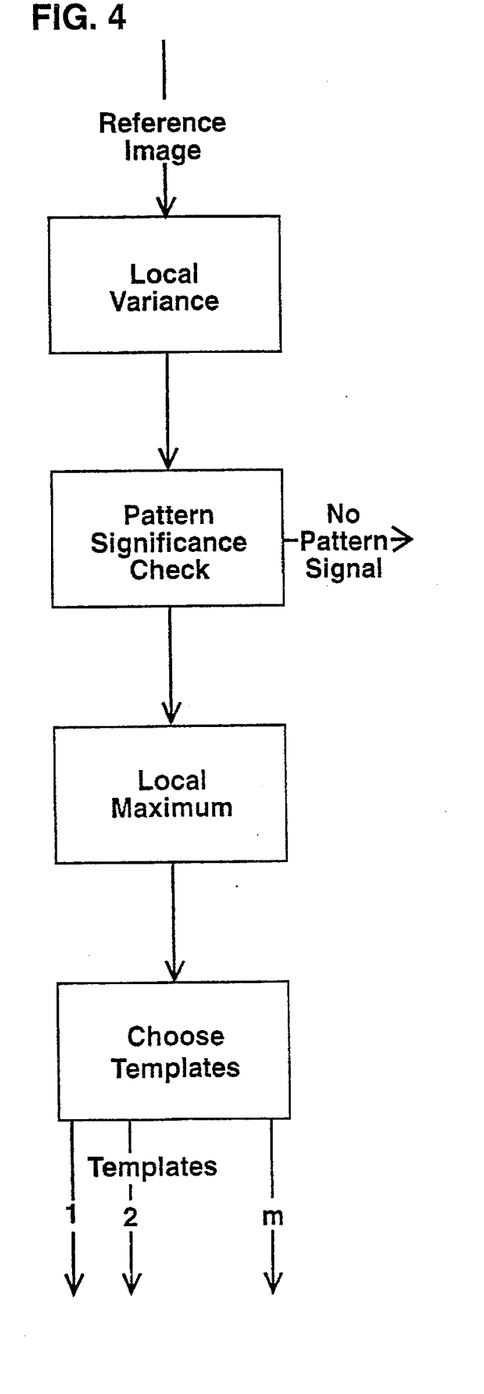
FIG. 4 is a schematic depiction of a pattern detection process which is the first stage in a registration process according to the present invention.

The flow of data through pattern detector 50 is shown in FIG. 4. The purpose of the pattern detection stage is to find templates of a predetermined size, 'M×M', in the reference image which contain sufficient information to render them suitable for use as a basis for finding the registration correction during the registration correction process of the registration step. The flow of data through pattern detector 50 includes four successive steps:

(i) The first step of pattern detection, as delineated above, is to calculate the local variance in a window having the dimensions M×M for each pixel obtained from the reference image. This creates a variance image whose pixels are variance values reflecting the mount of pattern in the M×M window, centered around the pixel.

(ii) The second step of pattern detection is a pattern significance check which includes carrying out a significance check for the existence of sufficient pattern information to carry out registration by (a) normalizing the variance image with respect to a maximum variance; and (b) checking that a minimum variance is below a pattern significance threshold. If the minimum variance is not below a pattern significance threshold, an insufficient pattern is assumed, and a 'no pattern signal' is set to 'on'. Otherwise, the 'no pattern signal' is 'off'. The 'no pattern signal' is passed, as shown in FIG. 3, onto analyzer 54 which performs the analyzing, third stage, of the registration step.

(ii) The third step of pattern detection is to find local maxima of the variance image. Any given pixel is considered to be a local maximum if its variance value is greater than, or equal to, the variances in a 5×5 neighborhood of pixels centered around the given pixel. This creates an image whose pixel values are the local variance if the pixel is a local maximum, and zero, if it is not. (iv) The fourth step of pattern detection is to choose 'm' templates, wherein 'm' is a fixed integer. The templates are preferably selected according to the largest local maxima which define non-intersecting M×M templates, and are to be passed onto correlator 52, which performs the correlating, second stage, of the registration step.

Figure 5:
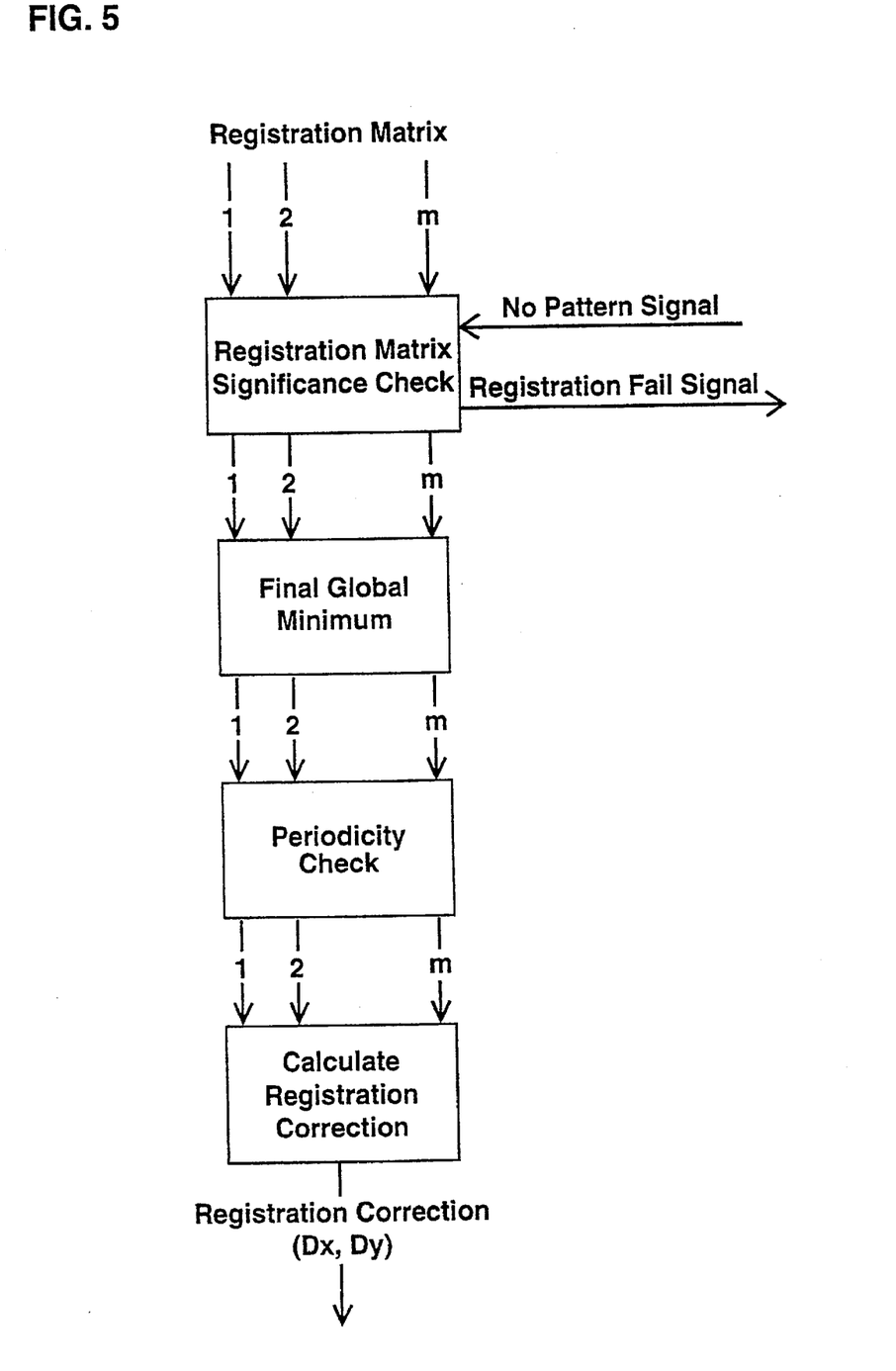
FIG. 5 is a schematic depiction of an analyzing process which is the third stage in a registration process according to the present invention.

As further shown in FIG. 3, the second stage of registration is performed by correlator 52. Correlator 52 calculates a registration matrix for each of the 'm' templates defined by pattern detector 50. To this end, for each template, is defined an N×N search window, centered on a pixel in the base image, which pixel corresponds to the center of the template. For each pixel of the N×N search window, a sum of absolute values of the differences between the template and the M×M window centered on the current pixel is calculated. This, in turn, generates the N×N registration matrix for each template. As shown in FIGS. 2 and 3, and detailed in FIG. 5, the third stage of registration is performed by analyzer 54 and includes four steps:

(i) During the first step of the analyzing stage, analyzer 54 notes whether the 'no pattern signal' is 'on' or 'off'. If the 'no pattern signal' is 'on', then the registration correction is set to (Dx, Dy)=(0,0) and the data are passed onto the comparison step, which, as shown in FIG. 2, is the second step of the image processing flow.

Otherwise, the analyzer carries out a registration matrix significance check for each of the 'm' registration matrices. This includes: (a) to normalize the entries of the registration matrices with respect to their maximum entry; (b) to assign a significance grade equal to the difference between the normalized maximum and normalized minimum entries, to each registration matrix; and (c) to check for each registration matrix for which the minimum normalized entry is below a registration significance threshold. If the minimum normalized entry is not below the registration significance threshold, then the registration matrix is defined as too 'flat' to produce a significant result and is, therefore, discarded. If all the 'm' registration matrices are discarded, registration for this perspective is deemed to have failed. In this case the 'registration fail' signal is set to 'on'. The 'registration fail' signal is passed onto the comparison step, which, as shown in FIG. 2, is the second step of the image processing flow. If 'registration fail' is 'on', the registration correction is automatically set to (Dx,Dy)=(0,0).

(ii) During the second step of the analyzing stage, analyzer 54 is to find a global minimum of each registration matrix that was not already discarded for being insignificant, as delineated above.

(iii) During the third step of the analyzing stage in which a periodicity check is performed, analyzer 54 is to check for pattern periodicity by: (a) normalizing each significant registration matrix with respect to the difference between the maximum and minimum entries (note that the 'minimum' is the 'global minimum' and its normalized value will, therefore, be zero); (b) checking each of the registration matrices for local minima less than a predetermined 'periodicity significance threshold', wherein all of the registration matrix minima with normalized values below the 'periodicity significance threshold' are candidates for the registration correction process; and (c) labeling a registration matrix with more than one candidate for the registration correction, as 'periodic', wherein if there is only one candidate, the registration matrix is defined as 'non-periodic'.

(iv) During the fourth and final step of the analyzing stage, analyzer 54 is to calculate the registration correction. This is the only step of analyzer 54 which takes into account all of the significant registration matrices together. Candidates for the registration correction are considered to be equal if they are within +/−1 of each other. There are three possible cases:

(1) If all the registration matrices are 'non-periodic', analyzer 54 is to count the number of times each candidate appears. The most frequently appearing candidate is the registration correction.

(2) If there are both 'periodic' and 'non-periodic' registration matrices, analyzer 54 is to create a list of candidates from the candidates appearing in the 'non-periodic' registration matrices and count the number of times each candidate in the list appears among all the registration matrices (both 'periodic' and 'non-periodic'). In a case where each of the candidates appears only once, analyzer 54 is to discard the 'non-periodic' registration matrices, and to set the case to be that of 'periodic' registration matrices only (see below). Otherwise, the most frequently appearing candidate is taken as the registration correction.

(3) If there are only 'periodic' registration matrices, analyzer 54 is to count the number of times each of the candidates appeared. The most frequently appearing candidate is the registration correction.

If no candidate appears more than once, the registration correction is taken from the registration matrix that received the highest significance grade in step (1) of the analyzer.

Having completed the registration step of the image processing flow, as shown in FIG. 2, the second step of image processing flow according to the method of the present invention, the comparison step, is carried out. As for the registration step, the comparison step is carried out for each perspective separately. During the comparison step a binary comparison map with the same pixel dimensions as the base image is produced.

Figure 6:
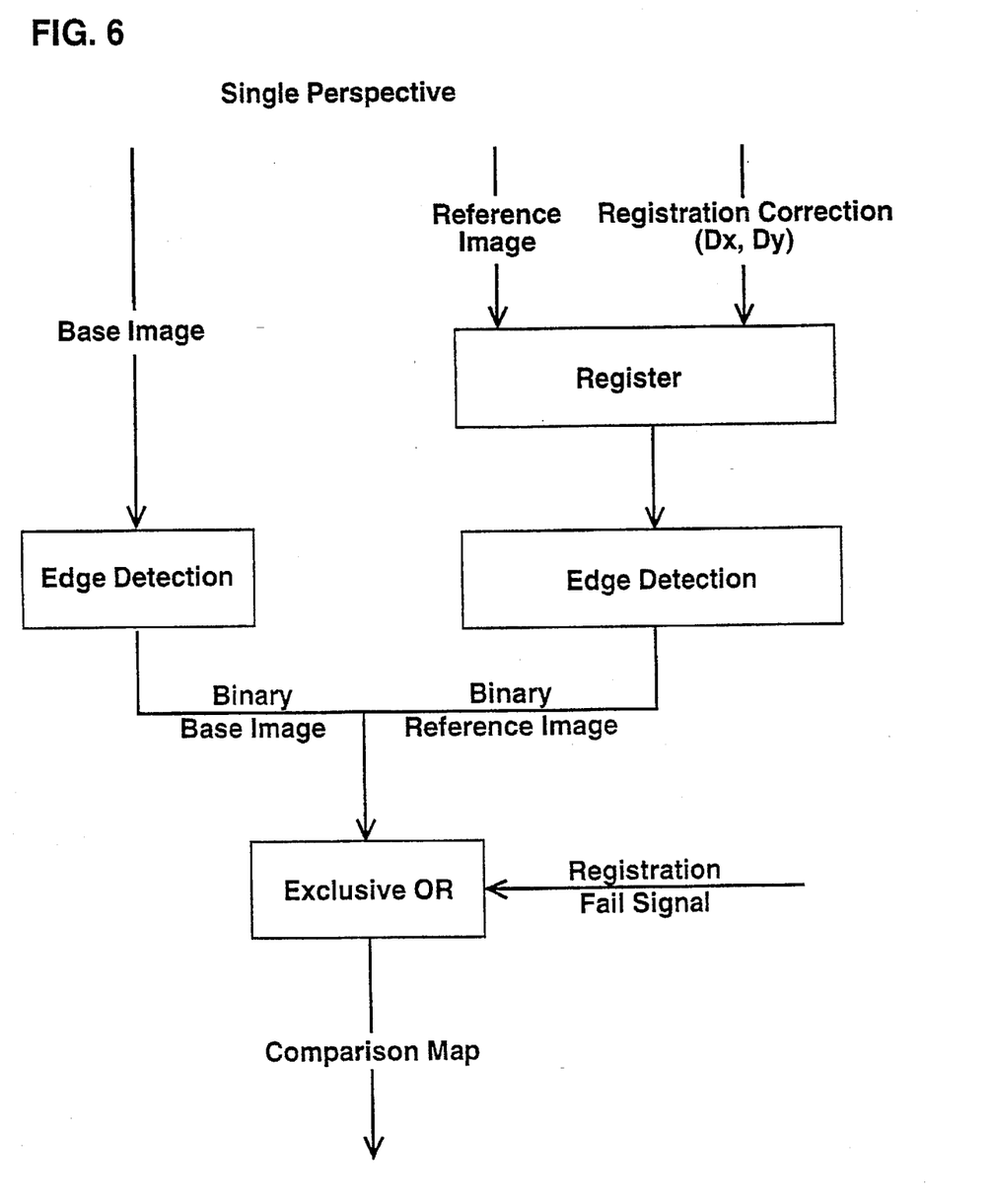
FIG. 6 is a schematic depiction of a comparison process which is the second step in an image processing flow according to the present invention.

As shown in FIG. 6, the comparison step includes three stages: (i) During the first stage of the comparison step, the registration correction coordinates (Dx,Dy) are applied to the reference image. (ii) During the second stage of the comparison step, an edge detection process, on both the reference and base images is performed. The edge detection process produces binary reference and base images as follows: a standard Laplucian operator is applied to each pixel of the image. Whenever the value of the standard Laplucian operator exceeds a fixed predetermined edge detection threshold, the binary output pixel is set to '1', otherwise, the binary output pixel is set to '0'.

(iii) Comparison is completed by comparing the binary reference and base images. If the registration fail signal is 'on', the comparison map is set to zero. Otherwise, the binary comparison map is a logical 'exclusive or' of the reference and base area images. That is, whenever there is a '1' in the reference area image and a '0' in the base area image, or vice versa, the corresponding pixel in the comparison map is set to '1'. Otherwise, the pixel in the comparison map is set to '0'. Another configuration in which the comparison map can be created is by operating directly on the base and reference area images (as opposed to their corresponding binary edge images). In this configuration, the absolute difference of the base and reference area images is calculated. For every difference exceeding a threshold value, a '1' is placed in the comparison map, whereas, for every difference not exceeding the threshold value, a '0' is placed in the comparison map.

Figure 7:
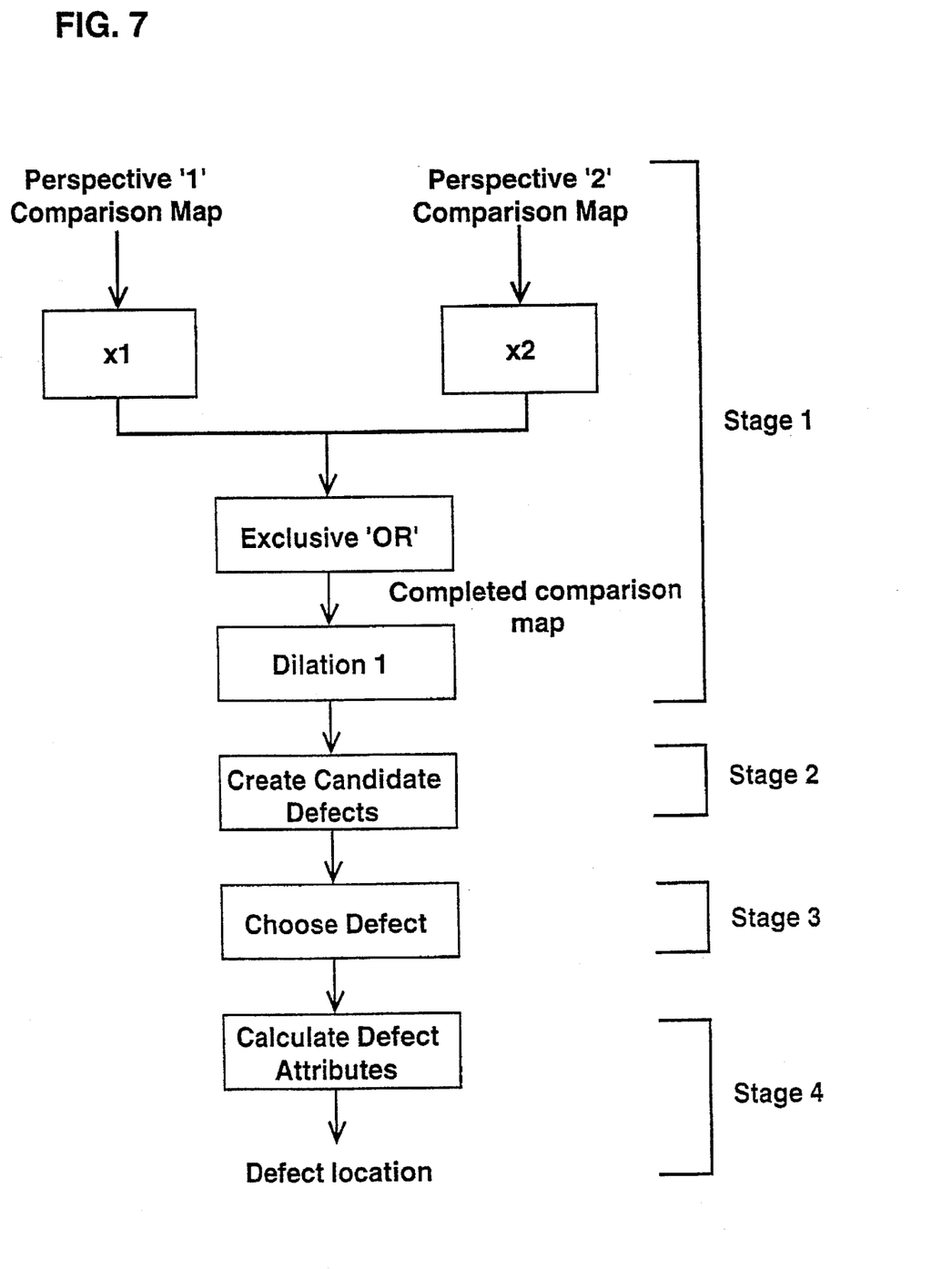
FIG. 7 is a schematic depiction of a comparison cross-checking process which is the third step in an image processing flow according to the present invention.

As shown in FIG. 2 and detailed in FIG. 7, the third and final step of the image processing flow for semiconductor wafer defect detection according to the present invention is the step of cross-checking between the two different perspectives. It will be recalled that the aim of cross-checking is to exploit different information present in each perspective, to increase the reliability of defect detection in the presence of, for example, noise and pattern variation.

Figure 8:
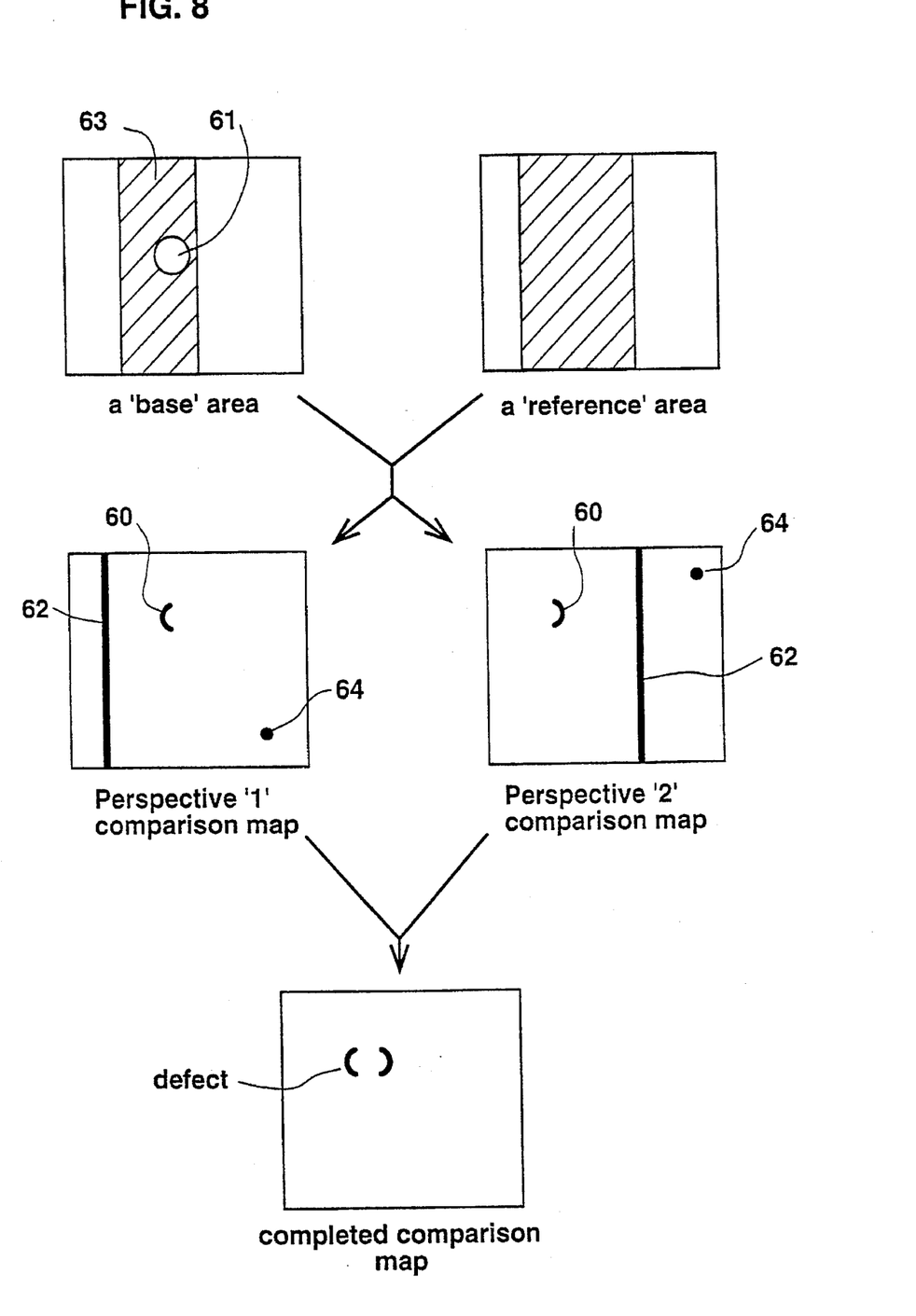
FIG. 8 is a schematic depiction of comparison maps obtained from two perspectives and their completed comparison map generated during the comparison cross-checking process which emphasize the ability of the method of the present invention to differentiate defects from semiconductor wafer pattern variations and noise produced during the scanning procedure.

As shown, for example, in FIG. 8, noise 64 is a random phenomenon, so that the likelihood that noise occurs in different perspectives in the same pixels is extremely small. By cross-checking data from different perspectives it should be possible to eliminate false alarms caused by noise.

As further shown in FIG. 8, pattern variation is not random, but, in the comparison maps of each perspective '1' and '2', appears as differences 62 in the edge information between the base area and the reference area. For a given feature 63, different edges are emphasized in different perspectives. So the pattern variation 62 associated with different edges appears in different perspective comparison maps. Furthermore, when perspective comparison maps are overlayed, events associated with pattern variation in different edges will be separated by the feature width.

This, however, is not the case for defects 61. While events 60 associated with defects 61 may appear in different perspective comparison maps, when the maps are overlayed, they will tend to be rather close to each other. Therefore, the cross-checking process provides a means for separating noise and pattern variations from defects.

Figure 9:
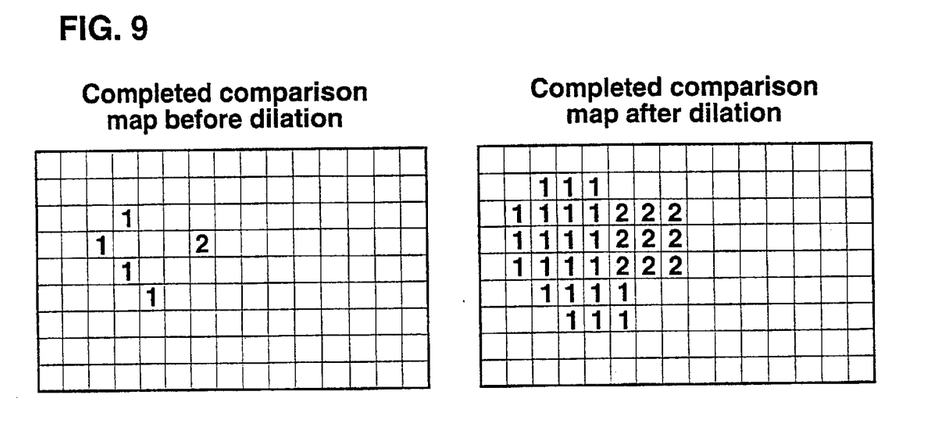
FIG. 9 is a schematic depiction of the first stage of the comparison cross-checking process, wherein dilation is applied to the completed comparison map.

As shown in FIGS. 7–10, the cross-checking process includes three major stages:

(i) The first stage of the cross-checking process includes: (a) each pixel of the perspective comparison maps is multiplied by a fixed value that can be used to identify the perspective. For example, each pixel of perspective '1' comparison map is multiplied by '1', and each pixel of the perspective '2' comparison map is multiplied by a '2'; the two perspective comparison maps are combined into a single completed comparison map by applying an 'exclusive or' operator. Note that pixels in the completed comparison map can take the values '0', '1', or '2'; (b) A morphological dilation operator is applied to the completed comparison map. Any pixel with a non-zero neighbor is given a non-zero value. As shown in FIG. 9, the value is set according to the majority value amongst the non-zero neighbors. If there is no majority, the pixel is given the highest value of its non-zero neighbors. The dilation operator can be applied one or more times.

Figure 10:
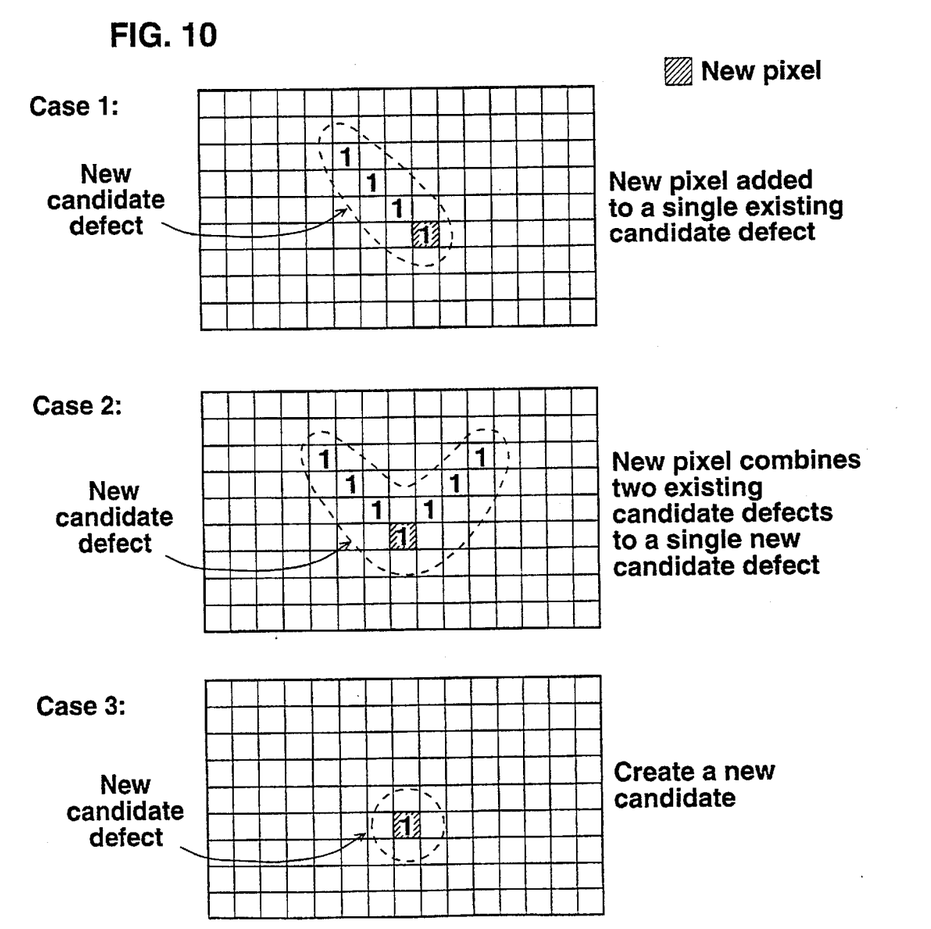
FIG. 10 is a schematic depiction of the second stage of the comparison cross-checking process, wherein a list of candidate defects from the completed, dilated, comparison map is produced.

(ii) The second stage of the cross-checking process, as shown in FIGS. 7 and detailed in FIG. 10, is to produce a list of candidate defects from the completed, dilated, comparison map. A candidate defect is any set of contiguous, non-zero pixels in the comparison map. Candidate defects are built up as follows; Starting in the top-left corner of the completed comparison map, for each non-zero pixel there are three cases:

(1) The new non-zero pixel can be connected by a contiguous set of non-zero pixels to a single existing candidate.

(2) The new non-zero pixel can be connected by contiguous sets of non-zero pixels to more than one existing candidate defect.

(3) The new non-zero pixel can not be connected to any existing candidate defects.

In case (1) above, the new non-zero pixel is added to the candidate defect. In case (2) above, all the candidate defects connected to the new non-zero pixel are combined into a single new candidate defect. In case (3) above, a new candidate defect is created.

(iii) The third stage of the cross-checking process is to decide which candidate defects are actually defects. Any candidate defect having more than a fixed threshold number of pixels from each perspective, is said to be a defect. The fixed detection threshold is greater than one. The method of the cross-checking process described above, requires that defects appear in both perspectives. Noise and pattern variations are filtered out from defects because, as stated with reference to FIG. 8 above, events in perspective comparison maps that are associated with defects tend to be far closer together than events associated with noise or pattern variation. So, a dilation operation will combine events in different perspectives associated with defects before it combines events in different perspectives associated with noise or pattern variation.

(iv) The final step of the comparison cross-checking process is to calculate attributes of the defect that can be used for classification.

The most basic attribute is the defect location which is set to be the center of gravity of the constituent pixels of the defect. Other examples of attributes are defect size, the number of pixels making up the defect, and defect boundary, the convex hull of the pixels making up the defect. The method of comparison followed by cross-check between perspective images can be exploited to calculate yet further attributes of defects such as whether the defect is above or below the wafer pattern. All these attributes can be used subsequently for defect classification.

The cross-checking process, described above, required a defect to appear in both perspective images. Another possibility for cross-checking is to require that defects appear in any one perspective comparison map. This makes it possible to detect defects in a depression that are hidden in one of the perspectives. In this case, defects have to be distinguished from noise and pattern variation by other characterizations than those described above. A minimum size requirement on defects will distinguish defects from noise and, to a lesser extent, pattern variation. Defects will be further distinguished from pattern variation by using properties of the pattern that are not true for defects. For example, the degree of linearity of the pattern is greater than that of the defect (see FIG. 8, and its accompanying description above). So a measure of linearity will help to separate defects and pattern variation.

To conclude, the method of the present invention is capable of distinguishing between a semiconductor wafer defect, on the one hand, and semiconductor wafer pattern variation or noise introduced during the scanning procedure, on the other. The ability of the method of the present invention to reliably distinguish between defects and pattern variations and/or noise is primarily due to the generation of a separate comparison map for each of the two perspectives employed, followed by generating a completed comparison map from the comparison maps of the individual perspectives. The ability of the method of the present invention to reliably distinguish between defects and pattern variations and/or noise, is a result of the completed comparison map being produced with significantly fewer false alarms than the perspective comparison maps themselves.

While the invention has been described with respect to a limited number of embodiments, it will be appreciated that many variations, modifications and other applications of the invention may be made.

What is claimed is:

1. A method of detecting defects in objects, such as semiconductor wafers, which include an array of ideally identical parts, the method comprising the steps of:

(i) inspecting a base area and at least one corresponding reference area of an object which includes an array of ideally identical parts, each of said areas being inspected from a plurality of angular sections thereby forming a base perspective image for each of said plurality of angular sections and a corresponding reference perspective image for each of said plurality of angular sections, respectively, wherein said inspection is performed by a scanning electron microscope apparatus including at least two detectors, thereby generating said base and said corresponding reference perspective images;

(ii) for each of said perspectives, comparing said base perspective image and said corresponding reference perspective image, and, for each of said perspectives, creating a perspective comparison map; and (iii) if a difference is indicated, cross checking said comparison maps created for each of said perspectives.

2. A method of detecting defects in objects, such as semiconductor wafers, which include an array of ideally identical parts, the method comprising the steps of:

(i) inspecting a base area and at least one corresponding reference area of an object which includes an array of ideally identical parts, each of said areas being inspected from at least two angular sections thereby forming a base perspective image for each of said at least two angular sections and a corresponding reference perspective image for each of said at least two angular sections, respectively, wherein said inspection is performed by a scanning electron microscope apparatus including at least two detectors, each of said detectors detecting electrons from a predefined angular section which is smaller than 180° and thereby generating said base and said corresponding reference perspective images;

(ii) for each of said perspectives, comparing said base perspective image and said corresponding reference perspective image, and, for each of said perspectives, creating a perspective comparison map, said perspective comparison map indicating differences between said base perspective image and said corresponding reference perspective image; and (iii) if a difference is indicated, cross checking said comparison maps created for each of said perspectives, thereby indicating substantially solely of presence of a defect and a location of said defect on said inspected object.

3. The method of claim 2, further comprising the step of processing a registration correction, said registration correction process precedes said comparison maps said registration correction process serves to correct differences between said base perspective image and said corresponding reference perspective image for each of said at least two angular sections, said differences introduced because said images were generated from different locations on said object.

4. The method of claim 3, wherein for said base perspective image and said corresponding reference perspective image of each of said at least two angular sections, said comparison maps produce binary comparison maps, said binary comparison maps reflect differences between said base perspective image and said corresponding reference perspective image, for each of said at least two angular sections.

5. The method of claim 2, wherein for said base perspective image and said corresponding reference perspective image of each of said at least two angular sections, said comparison maps produce binary comparison maps, said binary comparison maps reflect differences between said base perspective image and said corresponding reference perspective image, for each of said at least two angular sections.

6. The method of claim 2, wherein said base area is compared with a single corresponding reference area, said base and reference areas being each inspected from first and second angular sections to generate first and second base perspective images and first and second reference perspective images, respectively.

7. The method of claim 6, further comprising the step of processing a registration correction, said registration correction process precedes said comparison maps said registration correction process serves to correct differences between said first base perspective image and said first reference perspective image, and differences between said second base perspective image and said second reference perspective image, said differences introduced because said images were generated from different locations on said object.

8. The method of claim 7, wherein for said first base perspective image and said first reference perspective image, said comparison maps produce a first binary comparison map, said first binary comparison map reflects differences between said first base and reference perspective images, and for said second base perspective image and said second reference perspective image, said comparison maps produce a second binary comparison map, said second binary comparison map reflects differences between said second base and reference perspective images.

9. The method of claim 6, wherein for said first base perspective image and said first reference perspective image, said comparison maps produce a first binary comparison map, said first binary comparison map reflects differences between said first base and reference perspective images, and for said second base perspective image and said second reference perspective image, said comparison maps produce a second binary comparison map, said second binary comparison map reflects differences between said second base and reference perspective images.

10. The method of claim 6, wherein each of said detectors is selected from the group of detectors consisting of detectors which are external to said scanning electron microscope apparatus and detectors which are internal to said scanning electron microscope apparatus so called 'in lens' detectors.

11. The method of claim 6, wherein each of said detectors is selected from the group of detectors consisting of detectors detecting secondary emitted electrons and detectors detecting back scattered electrons.

12. The method of claim 6, wherein said cross checking is exploitation of differences of edges information present in each of said perspective comparison maps and generates a completed comparison map, said completed comparison map indicates substantially solely of presence of a defect and a location of said defect on said inspected object.

13. The method of claim 6, wherein said cross checking is exploitation of features unique to said defects, and said features are selected from the group of features consisting of size and shape.

14. The method of claim 2, wherein each of said detectors is selected from the group of detectors consisting of detectors which are external to said scanning electron microscope apparatus and detectors which are internal to said scanning electron microscope apparatus so called 'in lens' detectors.

15. The method of claim 2, wherein each of said detectors is selected from the group of detectors consisting of detectors detecting secondary emitted electrons and detectors detecting back scattered electrons.

16. The method of claim 2, wherein said cross checking is exploitation of differences of edges information present in each of said perspective comparison maps and generates a completed comparison map, said completed comparison map indicates substantially solely of presence of a defect and a location of said defect on said inspected object.

17. The method of claim 2, wherein said cross checking is exploitation of features unique to said defects, and said features are selected from the group of features consisting of size and shape.

* * * * *